United States Patent [19]
Birkle et al.

[11] Patent Number: 5,349,540
[45] Date of Patent: Sep. 20, 1994

[54] APPARATUS FOR DETERMINING THE STATE OF PHYSICAL PROPERTIES OF RECHARGEABLE ELECTRIC ENERGY STORAGE DEVICES

[75] Inventors: Michael Birkle; Gunther Grasemann; Hartwig Steusloff, all of Karlsruhe, Fed. Rep. of Germany

[73] Assignee: Fraunhofer Gesellschaft zur Foerder der angewandten Forschung e. V., Fed. Rep. of Germany

[21] Appl. No.: 784,444

[22] Filed: Nov. 12, 1991

[30] Foreign Application Priority Data

May 12, 1989 [DE] Fed. Rep. of Germany ....... 3915550
May 8, 1990 [WO] PCT Int'l Appl. ............... PCT/DE90/00322

[51] Int. Cl.$^5$ ............................................. G01R 13/36
[52] U.S. Cl. ..................................... 364/578; 324/427
[58] Field of Search ............... 364/578, 481, 483, 149, 364/150, 151; 395/916, 919, 920; 320/43, 44, 48; 324/427; 136/290; 340/636

[56] References Cited
U.S. PATENT DOCUMENTS

| 3,617,850 | 11/1971 | Domshy et al. | 320/43 |
| 3,886,442 | 5/1975 | Chiku et al. | 324/427 |
| 4,333,149 | 6/1982 | Taylor et al. | 364/481 |
| 4,390,841 | 6/1983 | Martin et al. | 324/427 |
| 4,595,880 | 6/1986 | Patil | 364/483 |
| 4,633,418 | 12/1986 | Bishop | 364/483 |
| 4,949,046 | 8/1990 | Seyfang | 324/427 |
| 4,952,862 | 8/1990 | Biagetti | 324/427 |
| 5,012,176 | 4/1991 | La Forge | 320/43 |
| 5,185,566 | 2/1993 | Goedken et al. | 320/48 |

Primary Examiner—Ellis B. Ramirez
Attorney, Agent, or Firm—Evenson, McKeown, Edwards & Lenahan

[57] ABSTRACT

A process for determination of the state of physical properties of rechargeable electric energy storage device. Process input values of the energy storage device are measured and processed in a computer, in accordance with a predetermined model in the form of closed linear or non-linear multiparametric functions or a heuristic prametering process to generate derived values for physical properties, which are compared with the measured process input values, and the model or estimation is modified for the succeeding measurement.

23 Claims, 5 Drawing Sheets

APPARATUS FOR DETERMINING THE STATE OF PHYSICAL PROPERTIES OF RECHARGEABLE ELECTRIC ENERGY STORAGE DEVICES

BACKGROUND AND SUMMARY OF THE INVENTION

The present invention relates to a process for the determination of the state of physical properties of rechargeable electric energy storage means, and an apparatus for carrying out the same.

Rechargeable (reversible) electric energy storage means are employed in very many areas today in order to ensure continued operation of electric devices without dependence on the mains supply. The presently most common types are lead, nickel-cadmium, sodium-sulphur, and lithium-fluor rechargeable batteries. Besides their many advantages. there are also drawbacks, for example, higher costs and greater maintenance requirements. The principle disadvantage, however is that the supply of energy is limited. Nonetheless, the fact that the tappable energy is limited and that the utilized rechargeable battery has to be replaced or recharged at some point is one that can be tolerated. The real problem is that one often does not know when that will be, i.e. how long one's device can still be operated with the rechargeable battery in use (how much energy/charge remains is in the battery).

In some fields of application these disadvantages are only a nuisance or expensive; in many cases they can, however, preclude the use of rechargeable batteries. In this case non-reversible, polluting primary cells are employed, which are more expensive and highly polluting after some use (number of cycles), but which present fewer problems regarding the charge data since the advanced condition of discharging becomes noticeable in time due to the drop in voltage. Fields in which safety is crucial, such as in medicine, traffic control, fire prevention, etc., and also many applications in hobbies (e.g. diving, mountain climbing, model-building) are slow in starting to employ rechargeable batteries or have hitherto not used them at all.

The reason for this is the behavior of most rechargeable batteries, as illustrated in FIG. 1 using the common Ni-Cad rechargeable batteries as an example:

Prior to the sudden, sharp drop in voltage just before total discharge there is a long phase in which the voltage is practically constant; during approx. 90% of the duration of the discharge (at constant current) the voltage only varies less than 10%. This property is initially a favorable state since practically constant voltage during nearly the entire duration of operation of the rechargeable battery ensures total efficiency of the device during this time. On the other hand, point C in the illustrated discharge curve, namely the point at which recharging is necessary does not become apparent until only substantially less than 10% of the overall charge is left following which voltage supply soon breaks down completely.

The only properties which can be measured without detriment to the rechargeable battery are magnitude of current and temperature, which are predetermined by the environment, and the voltage, which is at the electrodes of the rechargeable battery under these conditions. The nominal voltage of a rechargeable battery depends on its age and properties, which are subject to the statistical specimen deviation of a production series (hereinafter called statistical specimen deviation). As the change in voltage in the main part of the discharge process lies in the same magnitude as the mentioned dispersion of the nominal voltage, the voltage alone can only be a very poor measure of the charge/energy content of the rechargeable battery. Systems which derive the required data from the measurable properties are therefore necessary in order to determine the state of charge.

In the hitherto prior art methods of monitoring the charge condition, the easily measured properties of the process (current I, temperature T, voltage U and time t), which balance the charging/discharging right from the beginning of the process, are utilized with the aid of physical formulas (DE-PS 34 29 145) to estimate the state of charge.

None of the prior art methods has been adequate in practice. The reason lies in the unsatisfactory accuracy of measurement, and the marginal conditions that must be maintained for useful application:

The prior art processes/devices require a new battery to start the state of charge monitoring process; hitherto it has been impossible with previously used batteries. In particular with Ni-Cad cells it frequently occurs that batteries of unknown origin are employed. In this event monitoring in almost all cases is based on false input data, and therefore the determination of the available capacity must be incorrect.

During the lifetime of a battery, voltage must never reach zero, otherwise the monitoring unit will lose its memory and the following recharging monitoring will be based on a presumed new battery.

However, satisfactory accuracy of measurement is not ensured even if all the required marginal conditions are met, because, the indirect determination of the state of charge is based on easily measured values of dependencies in a table, but without taking into consideration either the individual manufacturing tolerances or the differences specific to type and manufacture.

The object of the present invention is therefore to design a process of determining the physical properties of rechargeable electric energy storage device, and apparatus for carrying out the same, with the input values of the process of the energy storage device being measured and processed in a computer in such a manner that even with energy storage means whose state of charge and origin is unknown a reliable determination can be made concerning its available capacity, age and efficiency.

The foregoing object is solved in accordance with the present invention which is predetermined model. Closed linear or non-linear multiparametric functions and/or a heuristic parametering are used to estimate the to-be-determined physical properties and their physical relationships to one another and the estimated values are compared with the measured values. The model and/or estimation process is then adapted for the succeeding measurement.

An introduction to the principle of measuring with observers is known from IEEE Transactions on Automatic Control, Vol. AC-16No. 6 Dec. 71, pages 596–602, "Introduction to Observers" by David G. Luenberger or from IEEE Transactions on Military Electronics, Vol. 7, 1963, David Luenberger: "Observing the State of a Linear System", pages 74–80, Prof. Zeitz, Michael, Bochum, "Nichtlineare Beobachter . . . " (Non-linear Observers), VDI-Verlag, Fortschrittberichte VDIZ, Reihe 8, NR. 27.

Indirect measuring employing models results in values that cannot be measured directly. A comparison of these values with the real values of the process is at the most possible at some later point (e.g. upon reaching complete discharge). Prior to this, however, undetermined influences can alter the process so that an initially unrecognizable measurement error occurs in the indirectly measured value.

For instance if the voltage is measured at the electrodes in the central region of operation of the rechargeable battery, it is hardly possible—even if the data of a closed model is known—to derive data about the state of charge of the rechargeable battery if it is a type of rechargeable battery which has an even voltage characteristic curve.

Only with knowledge of two essential properties is voltage a significant characteristic for the state of charge. These are the individual statistical specimen deviation and the state of aging. The variations in the voltage resulting therefrom lie in the same magnitude as those resulting from the change in the state of charge.

A direct measurement, e.g. according to DE-OS 3736481 is based on a new rechargeable battery, or a rechargeable battery of known age as well as on catalogue specifications for the individual energy storage. Individual deviations from the catalogue specifications are not taken into consideration just as deviations of the assumed age from the actual age.

The result is information about the state of charge of the rechargeable battery, which in an extreme case deviates very greatly from reality, without the measuring system receiving feedback about this deviation.

Other objects, advantages and novel features of the present invention will become apparent from the following detailed description of the invention when considered in conjunction with the accompanying drawings.

DETAILED DESCRIPTION OF THE DRAWINGS

Measurement and Observer Technique

In the measurement and observer technique, a model-supported simulation is run parallel to charging/discharging (process) with the same process input values being entered into the model as those of the process. The easily measured process output values, in this instance the voltage U(t), are compared with corresponding values from the model. Subsequently, the current model parameters are adapted to minimize the deviation between the real and model process output values, resulting in the following advantageous properties of the measuring system, which hereinafter is-referred to as monitor:

a) Due to the continuous iteration of the observer cycle, self-adaptation of the system occurs, which accommodates the statistical specimen deviation specific to all rechargeable batteries of any manufacture and type.
b) rechargeable batteries of unknown origin can be utilized, with the known data of the type serving as start values for the adaptation.
c) Following data loss due to a zero voltage stage, the system can make a fresh start.
d) Adaptation occurs automatically at the current characteristic curve of the rechargeable battery. All influence by the internal and external process conditions are taken into account.
e) The observer starts with the given values, e.g. catalogue or literature specifications, as model O-order. The current parameters of the model improve with each adaptation cycle.

Figure 2:
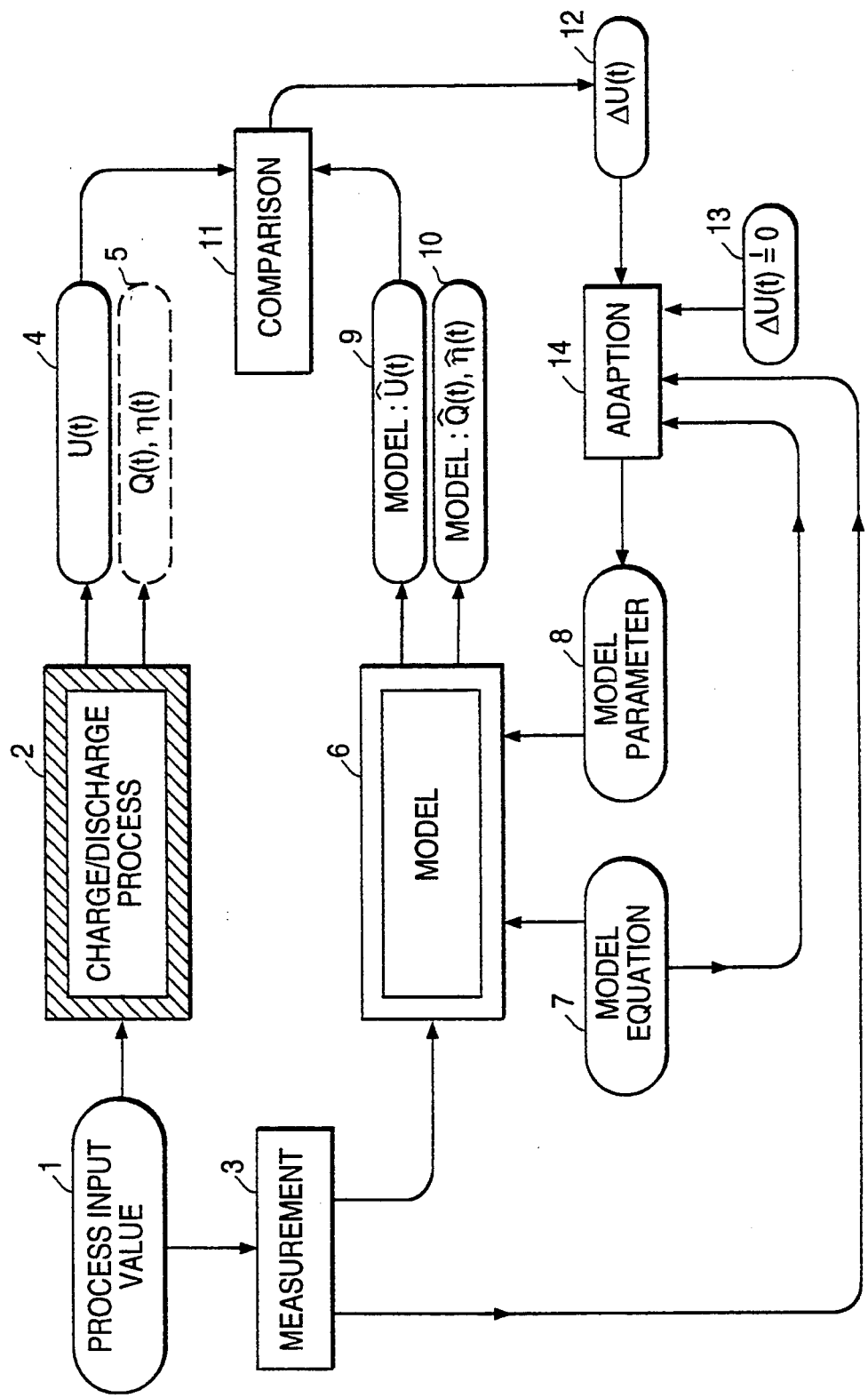
FIG. 2 is a schematic diagram illustrating the adaptation cycle of the method according to the invention, utilizing the observer principle.

The adaptation cycle based on the observer principle is illustrated in FIG. 2.

The easily measured process input values (1), current magnitude, time, temperature of the rechargeable battery and of the environment influence the real process of charging or discharging (2) and are measured simultaneously by the monitoring system (3).

In the process, the output values, some of which can be measured (in this case the voltage U(t) (4)), and some of which however inaccessible to direct measurement (5) (essentially the tappable amount of charge Q(t) and the differential charge efficiency $\theta_L(t)$), now occur at any time.

A model calculation (6) is conducted parallel to the real process. In the model the process input values stemming from the measurement are utilized to calculate the model output values $\hat{U}(t)$ (9) and $\hat{Q}(t)$ and $\eta_L(t)$ (10), which correspond to the actual process output values, using model equations (7) and the corresponding model parameters (8) of the current state of the process.

The model output values (10) corresponding to the unmeasurable process output values cannot be compared with them. This can only occur with the model output value corresponding to the voltage.

In the case of a deterministic, closed model coincidence of the two voltage values then corresponds to coincidence of the other values if all the parameters occur in the model equations for the voltage. In that event, it then is sufficient to minimize the deviation of both voltage values (11) in order to find a correct image of the process in given values (10).

For this purpose the set of model parameters is calculated anew from the voltage difference (12) together with the measured values from (3) and the model properties (equations and parameters, (7) and (8)) to minimize the voltage difference (13) and thus adapt (14) to the immediate state of the process.

Subsequently the model calculation (6) is carried out anew with the new parameters. The values (10) calculated thereby are then the result of the indirect measurement.

Heuristic Parameter Adaptation

The described observer cycle must be based on models in the form of closed functions, as e.g. equations according to the Peukert equations or multi-parametric functions. These functions may be linear or non-linear.

The more closed model equations describe the system, the smaller the number of possible solution vectors.

There is a single solution to the adaptation only if the model functions contain just enough open parameters as process values entering the model equations can be measured directly.

In practice, however, a system is usually underdetermined and there are always classes of possible solutions which can be represented as subspaces of the solution vector space.

In the extreme case, there are no given closed model equations at all, as a result of which at first all solution vectors in the parameter space are equivalent in a deterministic sense.

That is the case, for example, when the available capacity of an energy storage means whose characteristic curve, age and efficiency is unknown is to be measured. It is a different matter, however, if the possible solution vectors are considered with the assistance of previous knowledge. At first this previous knowledge contains only knowledge from experience with the treated class of rechargeable battery in general (e.g. Ni-Cad rechargeable batteries, lead rechargeable batteries, sodium rechargeable batteries) including the specific type of rechargeable battery (manufacture, size, nominal parameters) and is composed of the known principles concerning the process and the corresponding facts (data).

If in addition individual data of the rechargeable battery in question or measured values of the currently running process are also known, this information can also be drawn upon by means of specific guidelines for estimating the state of the system according to the Heuristic Parameter Adaptation technique.

Like in the case of measuring with the observer principle, after each iteration the process output values (in this case the voltage) are compared with the corresponding values of the model and in the event of deviations are adapted by means of a principle-based adaptation algorithm. Simple amplification (or damping) or adjustment in a simple control circuit (e.g. a transfer control with a time constant that is distinctly smaller than the duration of the scanning cycle) is not sufficient for this purpose. Although the primary goal is reached namely minimization of the present deviation—the parameters however are not checked with regard to the plausibility criteria which come from knowledge based on experience.

On the other hand, the entire previous knowledge from the process at hand enters into every step of the iterative, control-based parameter estimation and the stand-by state returned to, which is not left until there are new measured values; only if there is a plausible parameter configuration.

Under certain conditions (for example in the event of greater deviation between two measuring cycles), it may become necessary to reexamine the hitherto run real characteristic curve for plausibility regarding the newly estimated parameters ("back tracing"). It is similarly the case with the anticipated future course of the process; it too must be examined for plausibility ("forward tracing") and only when both branches yield reasonable results will the parameters be declared as plausible.

If no plausible set of parameters is found for the current configuration of the process on the basis of those from the last measuring cycle, so-called "back-tracking" has to be conducted as a further step. For this purpose, the measured values and parameter values are stored intermediately in regular intervals in order to be able to fall back on these values later on. Then another attempt is made with these values to obtain a more plausible configuration of parameters at the current point while taking into consideration the process data during the intermediate period.

In specific situations (for example in the case of disturbances from the outside or in the case of high-current discharges), an advance recalibration step can also become necessary. This is only carried out routinely at the "corner-points", i.e. when switching from charging to discharging and reverse.

In this recalibration those parameters are adapted which usually only change minimally, and under certain conditions (during full charging or total discharging) can be compared with the corresponding values of the process. If this means of comparison is not possible or if a reasonable parameter constellation is not obtained despite application of all the described methods, these parameters have to be reestimated from the knowledge gathered up to this point.

Figure 3:
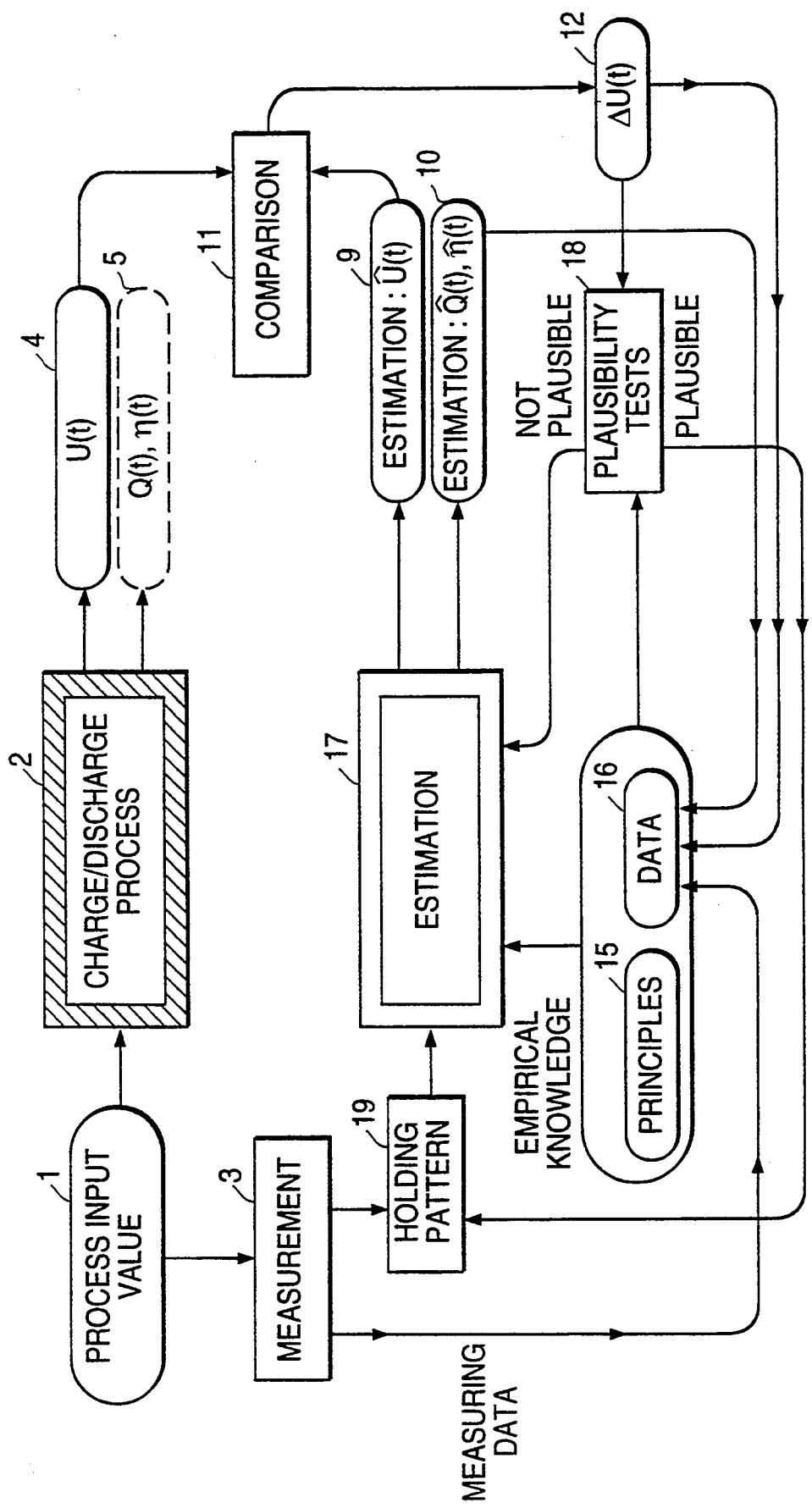
FIG. 3 is a schematic diagram illustrating the adaptation cycle of the method according to the invention, utilizing a heuristic estimation technique.

The mode of proceeding in a heuristic parameter adaptation is schematically illustrated in FIG. 3. Steps 1 to 5 correspond to those in FIG. 2.

Contrary to observer principle measurement, however, there can be no model calculation, because no closed equation system is available for linking the measured values from (3). The process output values (9) and (10) are instead estimated (17) according to the principles (15) stemming from experience together with the hitherto known data on the individual rechargeable battery (16). Following this the newly added data (9), (10), (11) and (12) are entered in the data base (16) and a series of plausibility tests (18) is conducted with the new constellation. If these tests are in intolerable contradiction to experience, reestimation is conducted possibly using one of the above-described processes (17). This estimation cycle is repeated—still on the basis of a single newly added measurement—until a plausible parameter constellation is found (19), which cannot be further improved. This one then is valid until the following measurement.

The event that no plausible parameter constellation is found is not provided for, because with a suitable set of principles this can be excluded. Thus, e.g., no set of parameters so plausible in all its aspects will be found with the measurement of a hitherto unknown battery and the conduction of a first measurement as those of a battery whose last 50 charging and discharging cycles have been recorded in one and the same device. In the former case the assumption of the standard properties from the catalogue table will have to be considered as plausible for the rechargeable battery until the measuring data permit drawing a different conclusion.

The plausibility tests thus have tolerance fields for the parameter constellation which permit concluding that an error is to be expected in the measured value. AS with time, thus the longer the monitor and the battery have worked together the smaller the tolerance fields for the parameter will get is therefore connected with an improvement of the quality of the measured value of the monitor.

Process Combinations

Determination of the state of charge of a reversible electric energy storage device, as described above, by means of indirect measurement using models can be achieved with two processes: the adaptation of parameters using the observer principle and with heuristic methods. Both approaches can be applied to both sub-branches (that is, the charge and discharge branch of the characteristic curve), and describe the charge and discharge behavior of the rechargeable battery in a deterministic or heuristic manner.

Both sub-branches permit extraction of detailed data via the current rechargeable battery parameters. Each process alone, however, and also any combination thereof, may conceivably be used in an embodiment of the monitor. The latter therefore may be constructed as a component a) only of the charge device b) only of the user device c) of the battery with combinations of solutions and mixed forms also being possible.

Model Approaches

The methods described above are ideal cases which practically do not occur in real rechargeable batteries. Neither can the overall operation of a rechargeable battery be completely described in dependence on all variables of state, nor can there be a total lack of model-like functional relationships which occur with conventional types. For this reason, the treated model approaches usually are combinations of deterministic and phenomenological functions as well as heuristic components. Which types of equations can be employed is illustrated in the following using a Ni-Cad rechargeable battery as an example.

Charge Model

The charge voltage of the Ni-Cad rechargeable battery can be represented from the deterministic approach for the passage voltage derived from the Butler-Volmer equation and from a phenomenological approach for the difference voltage as:

$$U_B = U_{ZG} + \frac{\text{arsinh}\left(\frac{I_B}{2I_o}\right)}{azf} - \frac{\ln(\alpha U_D \cdot I_B)}{P(L)} + U_{D_o} \quad (3.1)$$

All the values of the right side of the equation, with the exception of the charge current Is and the state L, are suitable as to-be-selected constants, or model parameters (e.g. $u_D$, $U_{ZG}$ Z, f). P(L) is a polynom, which is determined from the measured characteristic curve by means of numerical approximation. The charge current can be measured directly; the current state of charge can be ascertained from balancing the charged amount of charge if the differential degree of charge efficiency $\eta_L$, is known. The latter is defined as the tappable amount of charge resulting from a charge:

$$\eta_L = \frac{\delta L}{\delta Q_B} - \eta_L = \frac{dL}{dQ_B} \quad (3.2)$$

The differential charge efficiency is dependent on the charge current and the current state of charge, whereby this dependency can also be represented by means of a phenomenological approach:

$$\eta_L(L,I_B) = e^{P_m(L)} \cdot I_B + P_{\eta L_o}(L) \quad (3.3)$$

$P_m(L)$ and $P_{\eta L_o}(L)$ are polynomes (of the order approx. $\eta = 5$)

The actual available amount of charge can be balanced from the charged amount of charge with the known differential charge efficiency:

$$L = \sum_{Q_{B_i}} \eta_L \cdot \Delta Q_{B_i} \quad (3.4)$$

bzw.

$$L = \int_{Q_{B_o}}^{Q_B} \eta_L(L^-, I_B) dQ_B^-$$

and thus the model voltage value can be given according to (3.1).

The above illustrates the mixed deterministic and phenomenological model approach for the charge voltage of the Ni-Cad rechargeable battery.

If, by way of illustration, an unknown Ni-Cad rechargeable battery is utilized in a charge device with a monitor function and the voltage U(t) and the current I(t) are measured at its terminals, the model voltage $U_B(t)$ according to (3.1) coincides with the measured voltage only if it is a new empty free of statistical specimen deviation Ni-Cad rechargeable battery. In all other cases there is a voltage difference for the compensation of which approximately 20 parameters of the equations 3.1 and 3.3 may be changed. Any number of vectors can be found in this parameter space which ensure that the voltage difference disappears. In order to select the vectors reasonably for example the following rule is given.

In accordance with the monitor function method, insofar as there is no data to the contrary, initially it is assumed the battery is empty. However, if the utilized battery is only half-discharged, there is a considerably greater voltage than the model predicts under the assumption that the battery is empty. Thus the most obvious thing for the monitor to do is to reject the assumption that the battery is empty. The rule may be formulated as:

Rule 1

| | |
|---|---|
| If | a battery is newly utilized |
| and | there is no other data |
| and | the voltage at the terminals is too great, |
| | then the battery is most probably not empty therefore assume a higher state of charge. |

Prior to the next measuring cycle, the initially assumed zero state of charge is raised, e.g., by means of a PID principle characteristic, so that the errors, i.e., the voltage difference, becomes smaller. The system will have adapted following a few measuring cycles, and the voltage difference will have become very small. However, the assumption that the battery is new and just happens to meet the catalogue values with its parameters may also have been quite wrong. In this case, the now assumed state of charge is too great. This error can be read from the features of the characteristic curve after a series of measuring cycles has been run through. If the features of the characteristic curve of the real measured curve agree only poorly with those of the model, a new estimation of the individual standard capacity (which depends on the age and the statistical specimen deviation) can be conducted and the characteristic curve of the model can be calculated anew from the period in time of the model approach to the operation point and be compared with the real characteristic curve. In this way, without fail a different, namely, a smaller state of charge is yielded. At first a set of solution vectors from the two-dimensional space of the conceivable states of depletion and the fluctuation of this value due to statistical specimen deviation corresponds to the estimated nominal capacity to be found plausible as long as nothing indicates that this quantity has to be limited.

Rule 2 may therefore be applied if a portion of the charge characteristic curve has already been run through:

Rule 2

| If | Rule 1 has been applied |
|---|---|
| and | the features of the characteristic curve coincide only poorly |
| | then the assumed individual nominal capacity is incorrect |
| | therefore adapt the individual nominal capacity in such a manner that |
| | a) a plausible characteristic curve is yielded, |
| | b) the voltage difference becomes minimal under the to-be-assumed charge capacity |

The course of the characteristic curve is compared using easily extractable features such as curvature, incline, absolute value and integral (removed energy).

Discharging Model

Figure 1:
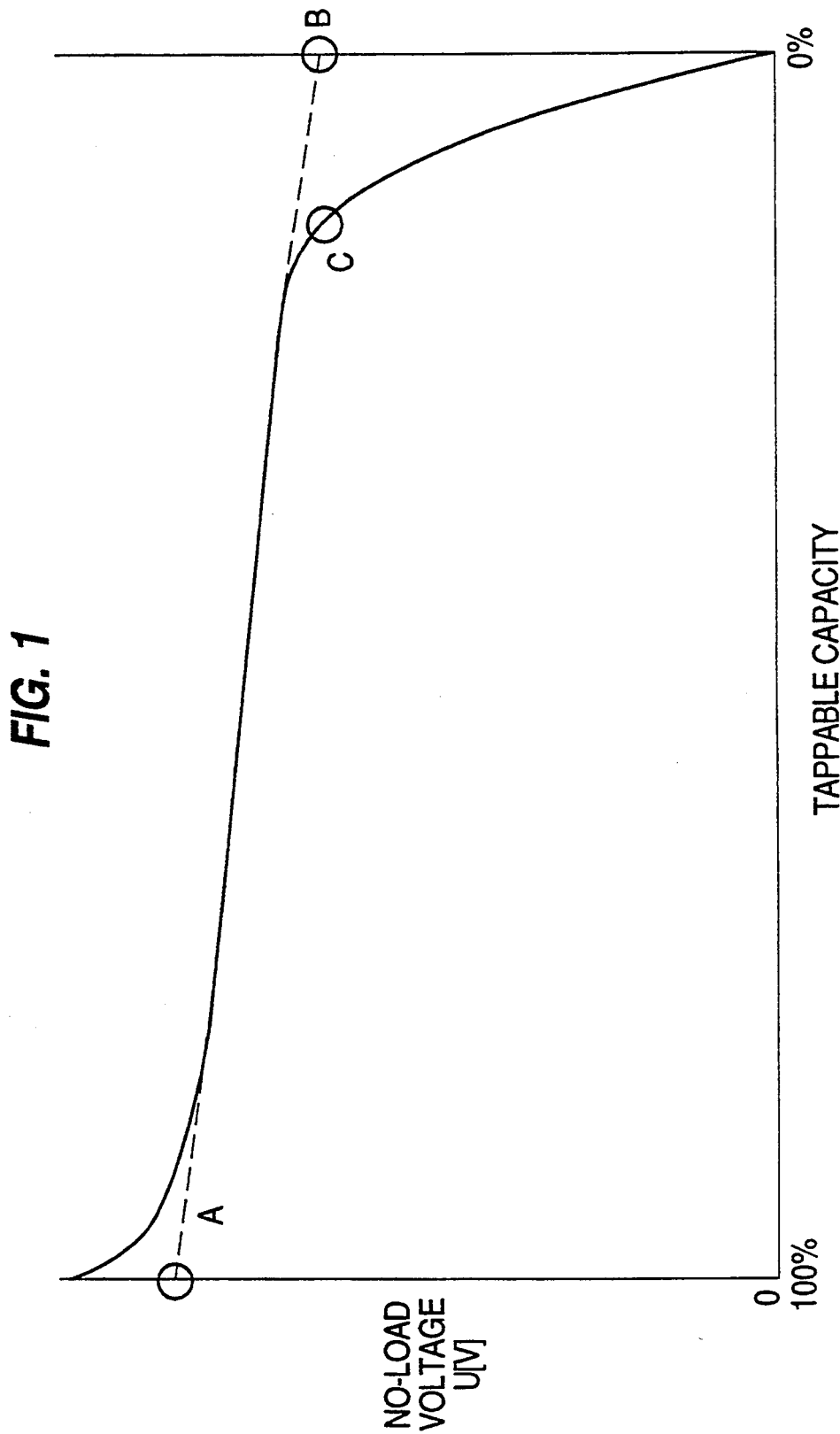
FIG. 1 a graphic representation of the functional relationship between the no-load voltage output and the available electric charge in a rechargeable electric energy storage device.

The course of the characteristic curve of the discharge (FIG. 1) shows three clearly distinguishable ranges: 1) A rapid decline at the start of the discharge 2) A long, nearly linear decline with very little incline 3) A sudden, steep drop Consequently the model approach consists of a l~near (more precisely: affine) main portion on which at the start and at the end an exponential function is superimposed.

The components are referred to as initial, linear and final portion, and are formulated as follows:

$$U_E(Q_E) = U_{Ei}(Q_E) + U_{El}(Q_E) - U_{Ef}(Q_E) \quad (3.5)$$
$$U_{El}(Q_E) = U_{Eio}(Q_E) + m_{UEi} \cdot Q_E \quad (3.5.a)$$
$$U_{Ei}(Q_E) = U_{Eio} \cdot e^{-\kappa U_{Ei} \cdot Q_E} \quad (3.5.b)$$
$$U_{Ef}(Q_E) = U_{Eio} \cdot e^{\kappa U_{Bf} \cdot Q_E} \quad (3.5.c)$$

Following insertion of a battery of unknown origin, initially the normal values of a fully charged battery are assumed.

However, the value of greater interest, namely the current cannot be directly concluded from the adaptation of the initial parameters.

The parameters taken from the initial course, however, do permit an improved estimation of the final course. This estimation will be even better if the linear portion could even be evaluated and the final course is best predictable if the system could remember this course at the last discharge.

The following two rules are given as examples for the conditional derivation of data from the measured values.

Rule 3

| If | the start of the linear range is typical for a half-depleted battery determined from the course of the curve |
|---|---|
| and | there is no other data, |
| then | the battery is most probably half-depleted. |

Rule 4

| If | the start of the linear range is typical for a half-depleted battery determined from the course of the curve |
|---|---|
| and | in the last cycle the battery was classified as only one quarter depleted |
| and | and nothing unusual occurred in the current cycle, |
| then | the battery is most probably only a little more than one quarter depleted. |

The numerical values and terms such as "most probably" are exemplary statements which are replaced by numbers, i.e. probability values, usage numbers, etc. in the actual current program. These numbers are specific to type; these simple rules are intended to only show by way of example how the measurements results are linked to preknowledge.

PREFERRED EMBODIMENTS

There are various versions of the apparatus for realizing the described process. The limitations are that in the case of purely charge devices (in which the rechargeable battery is inserted in a random condition and usually removed fully charged) only the charge branch can be evaluated, and in the case of a purely user device (in which a full rechargeable battery is inserted and removed empty) only the discharge branch can be evaluated.

The utilization of a monitor as part of the rechargeable battery, or a rechargeable battery package, aids the evaluation of both branches. The same is true for user devices in which the rechargeable battery does not leave for charging. Thus, it is of little significance if the rechargeable battery is soldered or easily replaceable. The use of rechargeable batteries of unknown origin only results in longer adaptation phases until the maximum attainable precision has set in once more.

However, the use of monitor functions in the devices corresponding to the respective characteristic branch presents the possibility of evaluating both courses if the rechargeable battery receives its current data on a semiconductor memory (RAM or EEPROM) and transmits these data to the respective other device. Even if only one of the two devices has a monitor, this provides the advantage that the monitor can draw back via the current characteristic curve upon the results from earlier evaluations of the characteristic curve, or of this rechargeable battery.

Based on the foregoing, the following embodiments of the monitor apparatus according to the invention are possible:

1. The monitor is part of only the charge device

Figure 4:
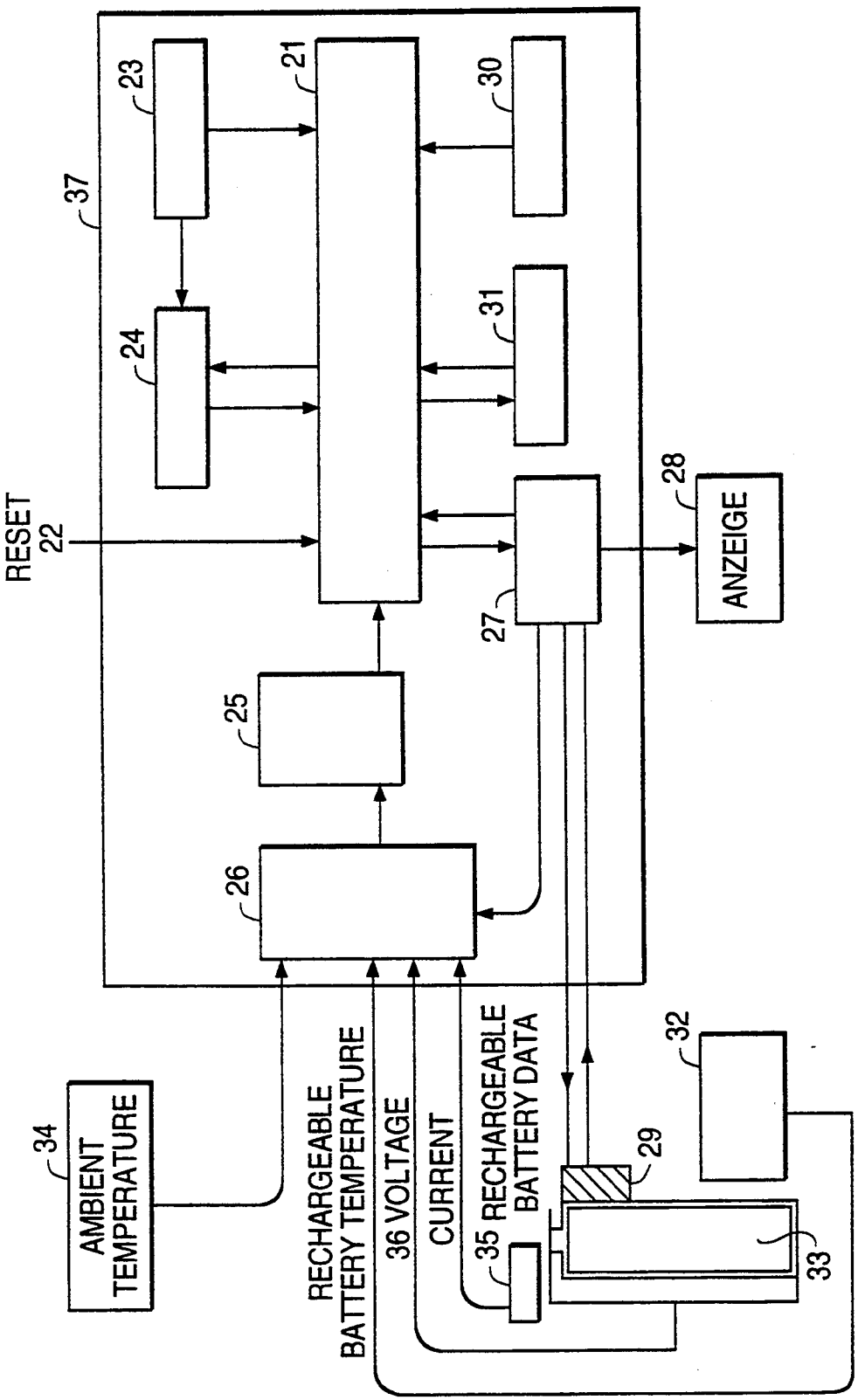
FIG. 4 is a schematic diagram of apparatus for carrying out the method according to the invention.

The state of charge monitoring system is an apparatus for carrying out the processes described above which is fixedly allocated to the charge device. FIG. 4 shows a block diagram of such an apparatus in which the individual components are described and their respective interaction is indicated by arrows. The central component of this discrete construction is a microprocessor (21), which as an 8-bit microcomputer is both economical and space-saving and on the other hand has all the features required for this purpose. If however respective precision and velocity are demanded, a 32-bit computer may also be employed.

The monitor (37) comprising components (21, 23, 24, 25, 26, 27, 30, 31) receives from charge device 28 with a display unit, besides its supply voltage, a RESET impulse (22) after the rechargeable battery (33) has been inserted and the charge process has been started. The time base is set by a timer (23) which may be designed as a quartz or as an electronic oscillator and also supplies, in addition to the CPU cycle the time cycle by means of a CTC=counter timer circuit (24) which generates the interruptions for the measured value reception. This is carried out by an analogue-digital converter (25) which transmits the measuring signal selected by a multiplexer (26) digitalized to the CPU (21).

The computer selects the input channel via an I/O component (27), which is also employed for the read-out of the digital results to the charge device (28) and, if need be, for communicating with the rechargeable battery memory (29).

Programs and rechargeable battery, respectively devicespecific data are given to the system on a non-volatile semiconductor memory (ROM, PROM, EPROM, EEPROM) (30). This component is the only one which has to be altered when transferring the system to another carrier device. In addition a volatile memory (SRAM, DRAM) is required for the course of the program, respectively its feed-in.

In addition to the-mentioned display, a temperature sensor (32) is to be installed in the periphery at the discharge battery (33) in the circumference of the charge device including a sensor for the ambient temperature (34) and a current sensor (35). The latter may be constructed, e.g., as a Hall sensor in order to influence the process as little as possible. The input signal for the voltage is tapped at the respective active terminal of the charge device by a sensor (36).

2. The monitor is part of only the user device

This construction corresponds to the diagram shown in FIG. 4; the monitor can be operated, like in the case of the charge device, with and without the memory means at the rechargeable battery.

3. The monitor is part of the battery

Points of intersection and data transfer are totally obviated if the monitor is a fixed part of the rechargeable battery or of a rechargeable battery package. Both the charging and the discharging branch are evaluated and all the monitor functions are optimally utilized. All the data of the battery are individually stored right from the start and can be retained even over a zero voltage passage by employing a non-volatile memory. Although this data retention is not required for the functionality of the system as data loss is followed by renewed adaptation, however an increase in the error intervals is avoided which goes along with a renewed adaptation start with the battery hen again of unknown origin.

4. The monitor is a system distributed on the user device and the charge device, with the battery receiving its current data from a memory.

The total utilization of all monitor functions is ensured even if the charge device and the user device each have an apparatus according to FIG. 4 and .the rechargeable battery carries its data in a non-volatile semiconductor memory fixedly attached to it in order to inform the respective other device to again impose the monitoring procedure. In the case of a volatile memory, the above-mentioned statements concerning errors are also true accordingly.

5. The monitor is realized as an ASIC with various programs for all applications 1-4.

In order, e.g., to be able to manufacture large quantities economically or in order to permit accommodation of the monitor in a confined space, the apparatus may also be designed as a highly integrated chip (ASIC).

In order to be utilized in all the realization forms according to FIGS. 1 to 4, the chip must receive all the programs required therefor, which are given a sequential number respectively, by which they can be selected.

Figure 5:
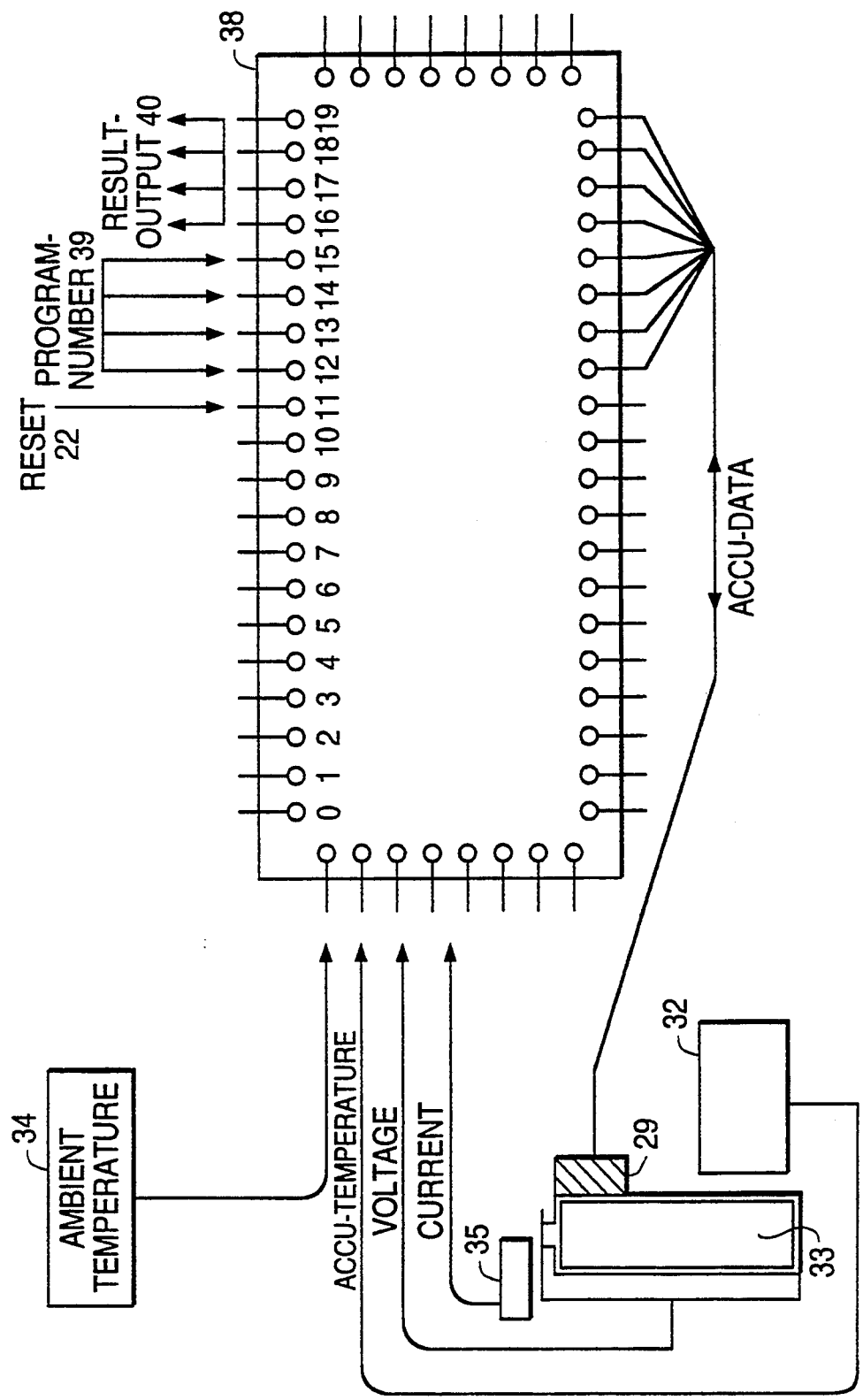
FIG. 5. is a diagram of a portion of the apparatus of FIG. 4 adapted to an integrated chip.

FIG. 5 shows in diagram a construction in which the parts within the frame (37) in FIG. 4 may be employed as macros for building up the highly integrated chip (38). The carrier device gives the chip a four-digit binary program number (39) which selects the point of entry in the monitor program at which the process is to be entered for the program start following RESET (22). The functionality corresponds then to the respective discrete build-up specific for this task.

In this manner the measured values which supply the charge/discharge characteristic curve are passed by chip (38) to memory (29), respectively are called by it. By knowing the manufacture and therewith the data of the energy storage means, these data can be entered via a program entry (39), in this manner avoiding large error intervals.

The four-digit binary result (if needed also with greater word lengths) are passed to the carrier device (40) via pins 16-19.

Although the invention has been described and illustrated in detail, it is to be clearly understood that the same is by way of illustration and example, and is not to be taken by way of limitation. The spirit and scope of the present invention are to be limited only by the terms of the appended claims.

We claim:

1. A method of determining a state of charge and other physical properties of a rechargeable electric energy storage apparatus, which storage apparatus is subjected to a process which alters said physical properties, said method comprising the steps of:

measuring at least one input value for said physical properties during said process;

processing said at least one input value in a data processor in accordance with a predetermined model in the form of a non-linear mulitparametric function and a heuristic parametering technique, said multiparametric function having more parameters than input values, said processing step including the step of first estimating an unknown solution value for said predetermined model using said heuristic parametering based on characteristic curves and data of known energy storage apparatus, and then estimating derived values for said state of charge and other physical properties, and generating relationships between said derived valued for said state of charge and other physical properties;

comparing said derived values with the measured input value for said physical properties;

adapting said predetermined model to minimize differences between said measured input value and derived values; and determining the state of charge and said other physical properties of said rechargeable electric energy storage apparatus from said comparing step.

2. Method according to claim 1, wherein said model is observer in the form of multiparametric differential equations which are one of closed linear and/or non-linear equations.

3. Method according to claim 1, wherein a new model is determined from said measured input values, and corresponding model equations and model parameters are applied to the same measurement.

4. Method according to claim 3, wherein said derived values comprise voltage, tappable charge and differential charge efficiency.

5. Method according to claim 1, wherein said physical properties are rechargeable battery parameters which are dependent on statistical specimen deviation and on the state of aging, and the currently available charge capacity.

6. Method according to claim 5, wherein said process is a charge-discharge cycle of said rechargeable electric energy storage apparatus, said at least one input value comprises a voltage which is compared with a derived value for said voltage.

7. Method according to claim 5, wherein a new model is determined from said measured input values, and corresponding model equations and model parameters are applied to the same measurement.

8. Method according to claim 1, wherein said process is a charge-discharge cycle of said rechargeable electric energy storage apparatus, and said at least one input value comprises a voltage which is compared with a derived value for said voltage.

9. Method according to claim 8, wherein said steps are repeated at least once.

10. Method according to claim 8, wherein a new model is determined from said measured input values, and corresponding model equations and model parameters are applied to the same measurement.

11. Method according to claim 1, wherein a new estimation is calculated from said measured input values and from utilization of corresponding principles and data of the same measurement, and said estimated output values for voltage, tappable charge and differential charge efficiency are determined therefrom.

12. Method according to claim 11, wherein a plausibility control of the derived values is conducted.

13. Method according to claim 12, wherein said measured values and derived values are stored intermediately.

14. Method according to claim 12, wherein said plausibility control of said new derived values is conducted for the previous and the future measurements and following which a comparison of the derived and measured values is conducted at least once.

15. Method according to claim 14, wherein said measured valued and derived values are stored intermediately.

16. Arrangement for determining a state of physical properties of rechargeable electric energy storage apparatus, which apparatus is subjected to a process which alters said physical properties, said arrangement comprising:

means for measuring at least one input value for said physical properties;

a microprocessor processing said at least one input value in accordance with a predetermined model in the form of a non-linear multiparametric function and a heuristic parametering technique, said multiparametric function having more parameters than input values, said microprocessor first estimating an unknown solution value for said predetermined model using said heuristic parametering based on characteristic curves and data of known energy storage apparatus, and then estimating derived values for said state of charge and other physical properties, and generating relationships between said derived values for said state of charge and other physical properties;

an analog to digital converter coupled to receive said at least one measured input value;

a multiplexer coupled to receive digitized input values from said analog to digital converter and to transmit said digitized input values to said microprocessor;

timer means, including, a timer-counter circuit, for generating time interval signals to control the timing of measurements of said at least one input value;

first memory means associated with said rechargeable energy storage apparatus comparing measured input value with derived values for said physical properties generated by said microprocessor;

an input-output interface unit connected to said microprocessor, said multiplexer, said first memory means and a charge device;

second and third memory means for receiving programs and data of said rechargeable energy storage means;

wherein said arrangement determines the state of said physical properties of said rechargeable electric energy storage apparatus from the comparison of the measured input value with said derived values.

17. Apparatus according to claim 16, wherein said apparatus comprises an integrated chip.

18. Apparatus according to claim 16, wherein said arrangement is a part of said rechargeable electric energy storage apparatus.

19. Apparatus according to claim 16, wherein said arrangement is a part of a charge device.

20. Apparatus according to claim 16, wherein said arrangement is part of a user device.

21. Apparatus according to claim 19, wherein said rechargeable electric energy storage apparatus has a memory in the form of one of: a random access memory and an EEPROM, with a contact point to said charge device.

22. Apparatus according to claim 19, wherein said rechargeable electric energy storage apparatus has a memory in the form of one of: a random access memory and an EEPROM, with a contact point to said user device.

23. Apparatus according to claim 21, wherein said apparatus comprises an integrated chip.

* * * * *